(12) United States Patent
Yamakami et al.

(10) Patent No.: US 8,183,464 B2
(45) Date of Patent: May 22, 2012

(54) SUBSTRATE PAD STRUCTURE

(75) Inventors: Tohru Yamakami, Shinagawa (JP);
Osamu Daikuhara, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 836 days.

(21) Appl. No.: 12/081,617

(22) Filed: Apr. 18, 2008

(65) Prior Publication Data
US 2009/0145653 A1    Jun. 11, 2009

(30) Foreign Application Priority Data
Dec. 7, 2007   (JP) ................. 2007-316704

(51) Int. Cl.
  *H05K 1/16*   (2006.01)
  *H05K 1/11*   (2006.01)
(52) U.S. Cl. ......... 174/260; 174/261; 174/267; 361/760
(58) Field of Classification Search .................. None
  See application file for complete search history.

(56) References Cited

U.S. PATENT DOCUMENTS

| | | | | |
|---|---|---|---|---|
| 6,486,698 B2* | 11/2002 | Yanagawa | ................. | 326/30 |
| 6,617,521 B1* | 9/2003 | Saito et al. | ................. | 174/260 |
| 6,740,822 B2* | 5/2004 | Watanabe | ................. | 174/260 |

FOREIGN PATENT DOCUMENTS

| | | | |
|---|---|---|---|
| JP | 05-063132 | | 3/1993 |
| JP | 2000-261131 | * | 9/2000 |
| JP | 2007-281122 | | 10/2007 |

* cited by examiner

*Primary Examiner* — Jayprakash N Gandhi
*Assistant Examiner* — Dion Ferguson
(74) *Attorney, Agent, or Firm* — IPUSA, PLLC

(57) ABSTRACT

A substrate pad structure for connecting a lead connecting portion of an electronic device to a substrate is disclosed. The substrate pad structure includes a first pad portion and a second pad portion that are arranged on the substrate at corresponding positions of two end regions of the lead connecting portion, which has a continuous oblong shape. A space portion is provided between the first pad portion and the second pad portion, and the lead connecting portion includes a non-connected region located at a corresponding position of the space portion.

8 Claims, 12 Drawing Sheets

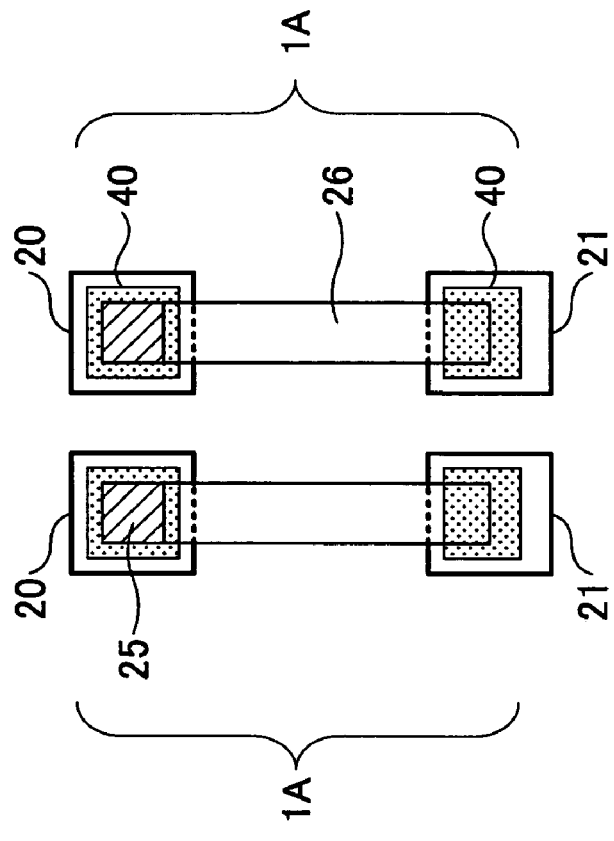
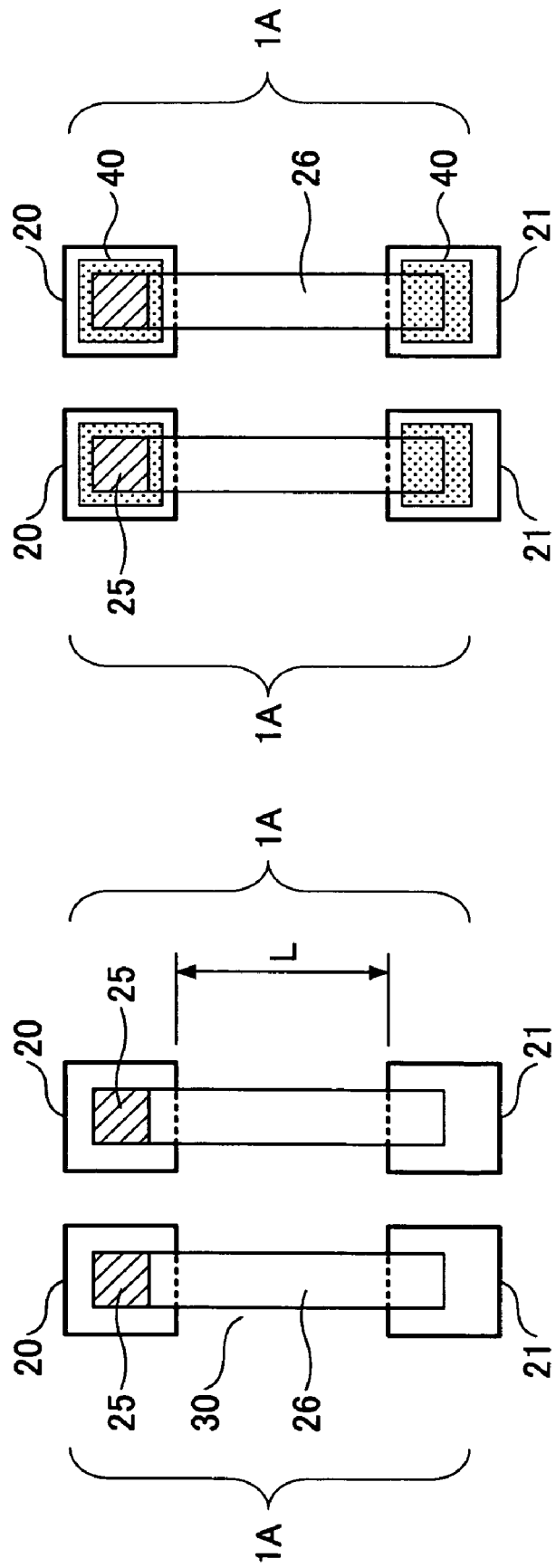

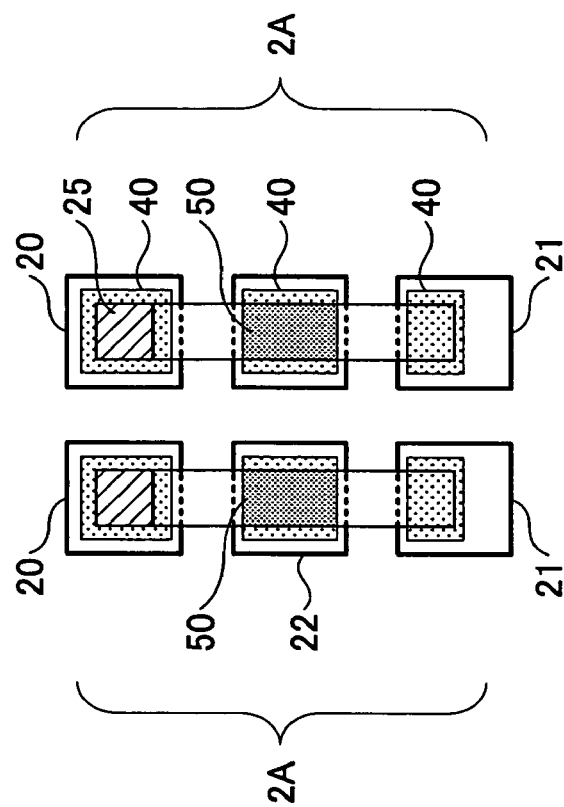
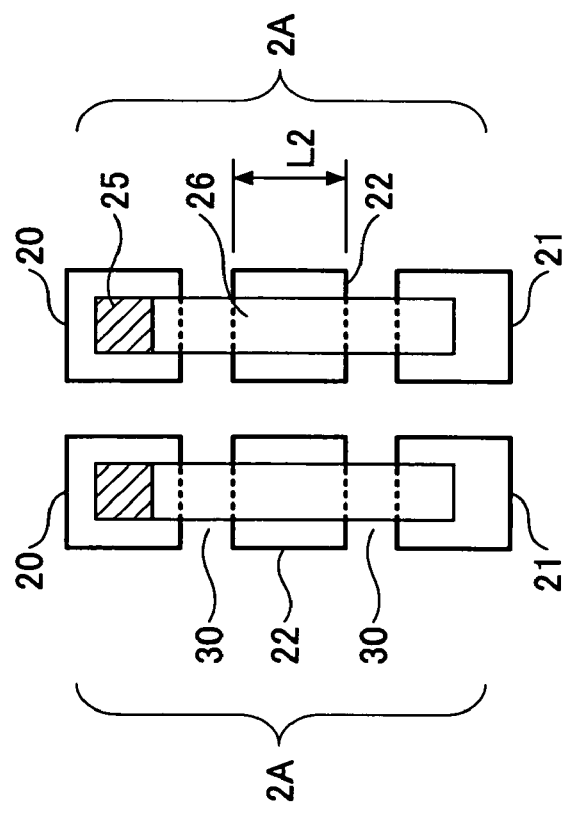

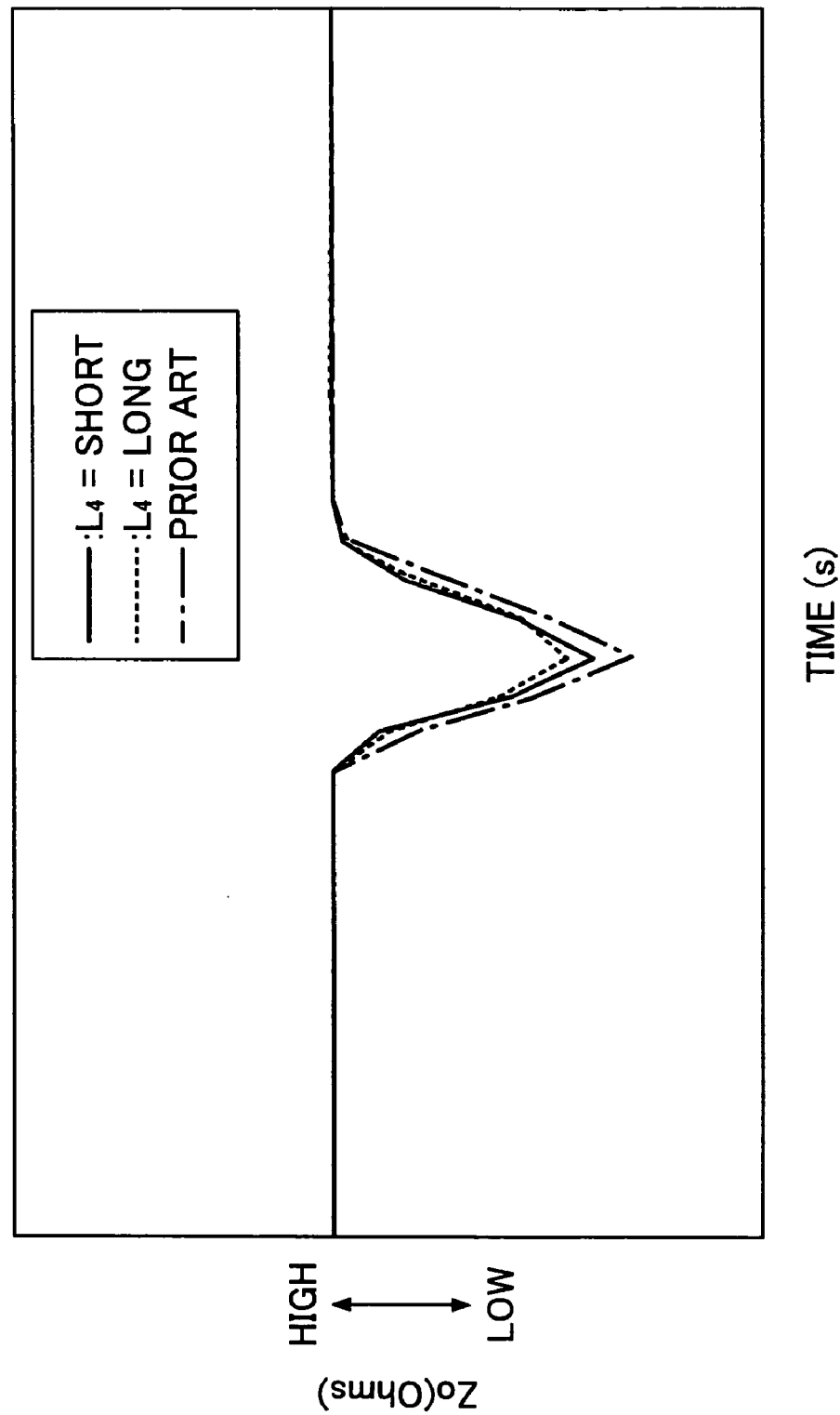

SUBSTRATE PAD STRUCTURE

BACKGROUND OF THE INVENTION

1. Field of the Invention

The present invention relates to a substrate pad structure that is configured to be connected to a lead terminal connecting portion of an electronic device that is mounted on the surface of a substrate.

2. Description of the Related Art

Conventionally, electrical connection between a substrate and an electronic device such as a connector that is surface-mounted on the substrate is established by attaching plural connecting portions of connector lead terminals to plural pads arranged on the substrate using solder, for example.

FIG. 1A is a diagram showing a coaxial cable connecter 150 being connected to one edge of an evaluation substrate 100 that evaluates transmission characteristics of a cable assembly. FIG. 1B is a diagram showing connecting portions 252 of lead terminals 250 of the connector 150 attached to pads 200 arranged on the substrate 100 so that electrical connection is established between the connector 150 and the substrate 100.

FIG. 2A is an enlarged view of the lead terminals 250 of the connector 150. The lead terminals 250 maybe positive signal terminals, negative signal terminals, or ground terminals that are connected to corresponding pads 200 arranged on the substrate 100. FIG. 2B is a diagram showing an arrangement of the pads 200 on the substrate 100.

FIG. 3A is a plan view of the connector lead terminals 250 connected to the pads 200. As is shown in this drawing, the connecting portions 252 of the connector lead terminals 250 and the pads 200 are arranged into oblong shapes with the pads 200 being slightly larger in size so that the connecting portions 252 of the connector lead terminals 250 may be soldered onto the pads 200. FIG. 3B is a side view of the connection between the connector lead terminal 250 and the pad 200. As is shown in this drawing, the entire bottom face of the lead terminal connecting portion 252 comes into contact with the surface of the pad 200.

It is noted that Japanese Laid-Open Patent Publication No. 5-63132 discloses a technique for accurately connecting lead terminals to pads of a substrate without having any positioning deviations by adjusting the shape of the lead terminal.

However, when the entire bottom face of the lead terminal connecting portion is arranged to come into contact with the surface of the pad, characteristic impedance matching may not be adequately performed when transmitting a signal of a high frequency range and signal reflection may occur so that transmission characteristics may be prone to degradation.

SUMMARY OF THE INVENTION

An aspect of the present invention is directed to providing a substrate pad structure that is configured to adjust characteristic impedance matching between a connector lead terminal of an electronic device and a pad while reinforcing the connection between a connecting portion of the connector lead terminal and the pad.

According to one embodiment of the present invention, a substrate pad structure is provided for connecting a lead connecting portion of an electronic device to a substrate, the substrate pad structure including:

a first pad portion and a second pad portion that are arranged on the substrate at corresponding positions of two end regions of the lead connecting portion, which lead connecting portion has a continuous oblong shape;

wherein a space portion is provided between the first pad portion and the second pad portion, and the lead connecting portion includes a non-connected region located at a corresponding position of the space portion.

BRIEF DESCRIPTION OF THE DRAWINGS

FIGS. 4A and 4B are diagrams showing a connection arrangement between lead terminal connecting portions and pads according to a first embodiment of the present invention;

FIGS. 6A and 6B are diagrams showing a connection arrangement between lead terminal connecting portions and pads according to a second embodiment of the present invention;

FIG. 11 is a graph showing time domain reflectometry (TDR) waveforms obtained with respect to the pad structure according to the fourth embodiment.

DESCRIPTION OF THE PREFERRED EMBODIMENTS

Figure 1A:
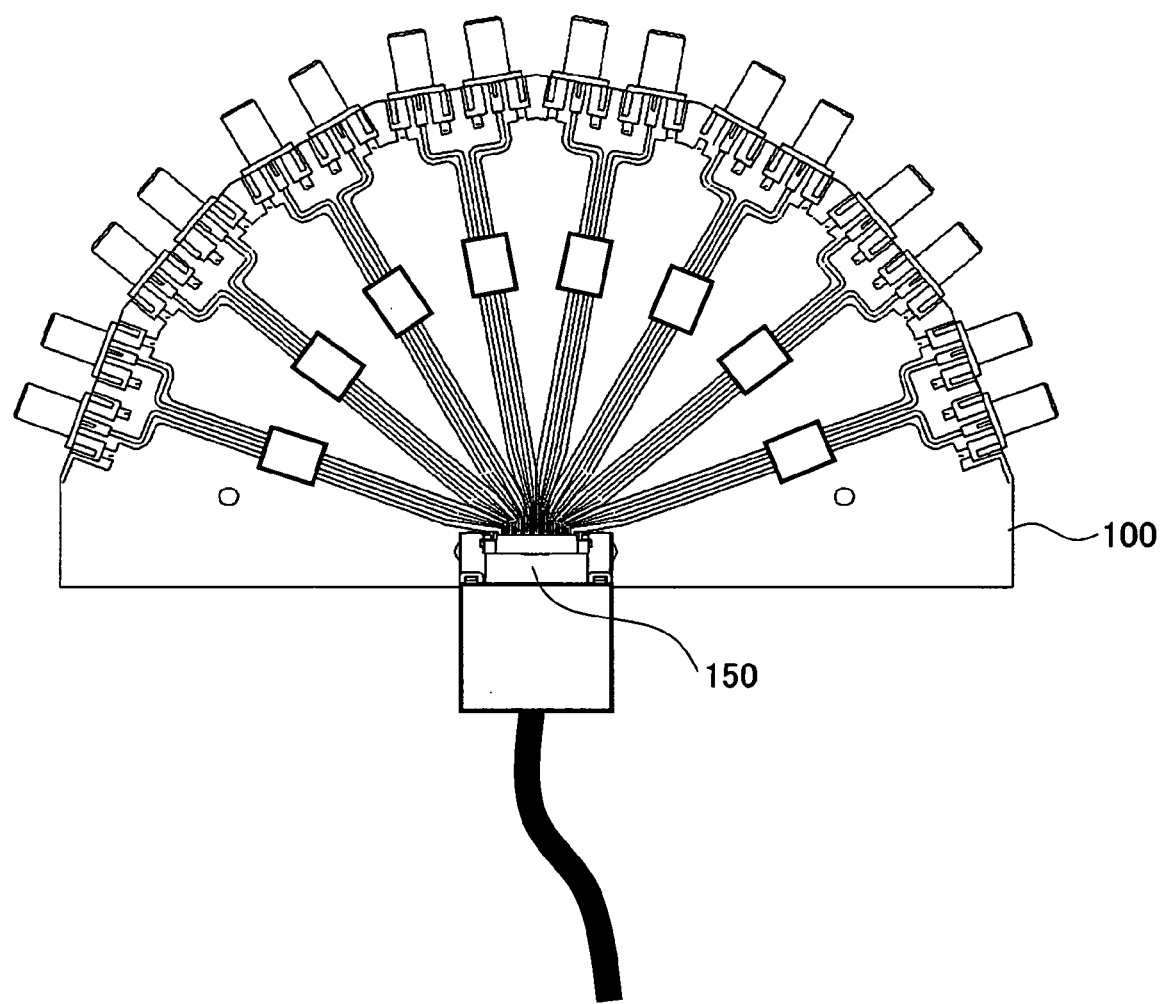
FIG. 1A is a diagram showing coaxial cable connectors connected to a substrate.
Figure 1B:
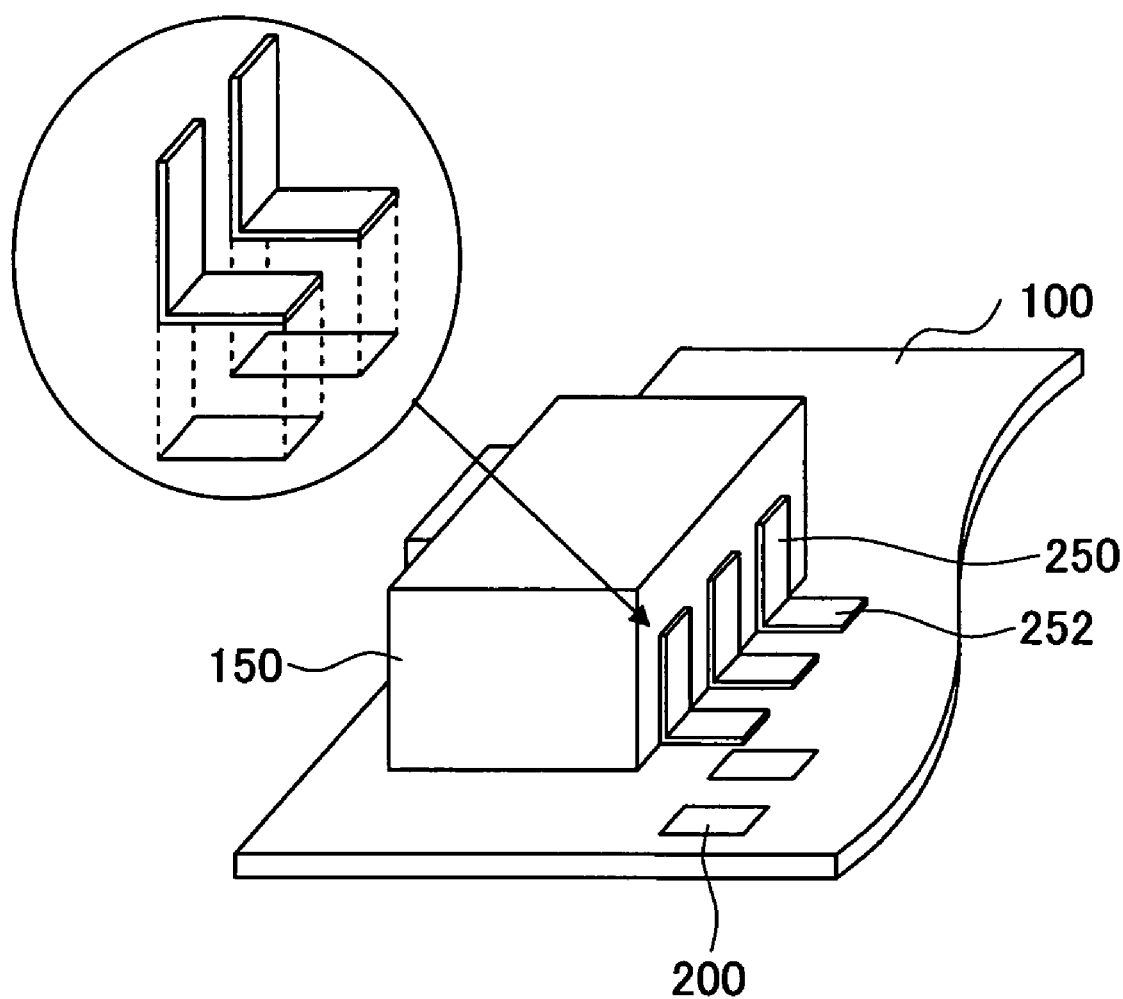
FIG. 1B is a diagram showing connector lead terminals connected to pads arranged on the substrate.
Figure 2A:
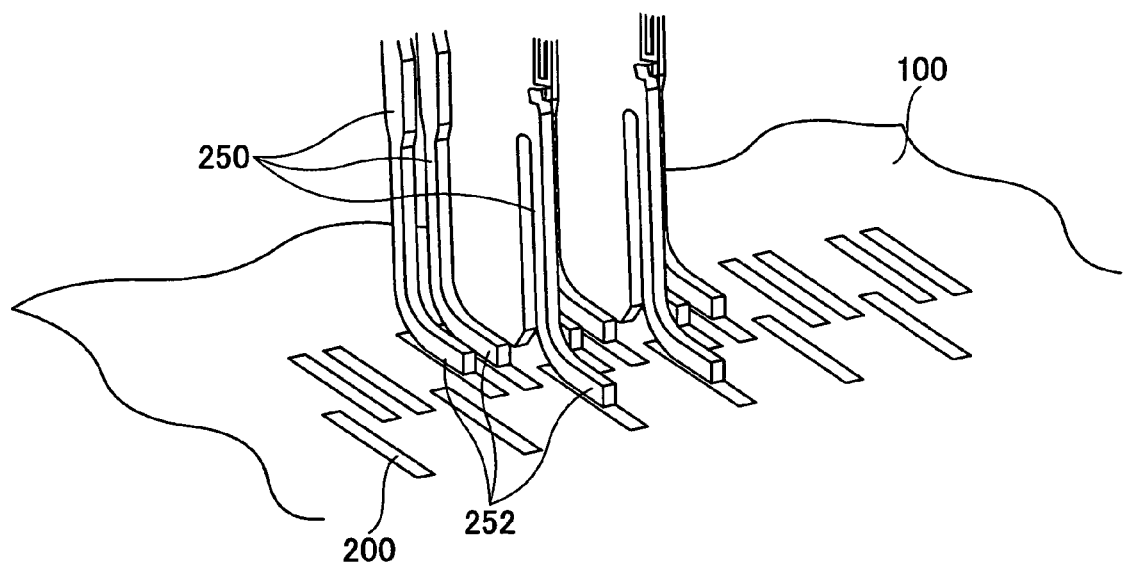
FIG. 2A is an enlarged view of the connector lead terminals connected to the pads.
Figure 2B:
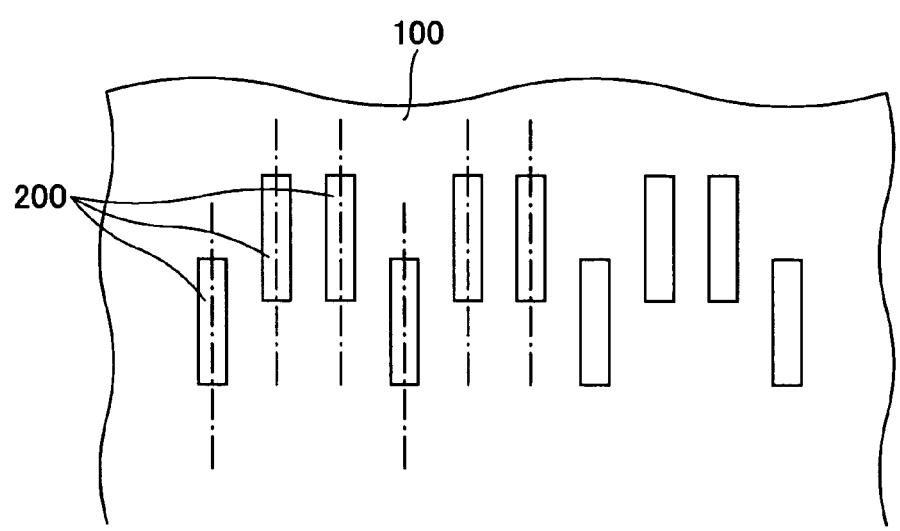
FIG. 2B is a diagram showing an arrangement of the pads.

In the following, preferred embodiments of the present invention are described with reference to the accompanying drawings.

[First Embodiment]

FIGS. 4A and 4B are diagrams showing a connection arrangement between pads 1A according to a first embodiment of the present invention and connecting portions 26 of connector lead terminals 25. Specifically, FIG. 4A is a plan view of two parallel pads 1A connected to corresponding lead terminal connecting portions 26, and FIG. 4B is a corresponding plan view showing regions 40 on which solder is applied upon soldering the connecting portions 26 of the lead terminals 25 onto the pads 1A.

The pad 1A according to the present embodiment includes a rectangular/square first pad portion 20 and a rectangular/square second pad portion 21 with a space portion 30 formed between the first pad portion 20 and the second pad portion 21. It is noted that the pad portions 20 and 21 may be made of a metal with relatively high conductivity, such as copper.

As is shown in FIG. 4A, the first pad portion 20 and the second pad portion 21 are each arranged at the ends of the lead terminal connecting portion 26. The ends of the lead terminal connecting portion 26 are soldered to the corresponding pad portions 20 and 21. However, an intermediate portion of the lead terminal connecting portion 26 is not connected to the pad 1A.

In the present embodiment, the second pad portion 21 functions as an electrical connection terminal of a substrate that conveys an electrical signal from the lead terminal to a circuit portion of the substrate. On the other hand, the first pad portion 20 is configured to reinforce the mechanical strength of the connection between the lead terminal connecting portion 26 and the substrate and adjust characteristic impedance matching between the lead terminal 25 and the pad 1A.

Figure 5:
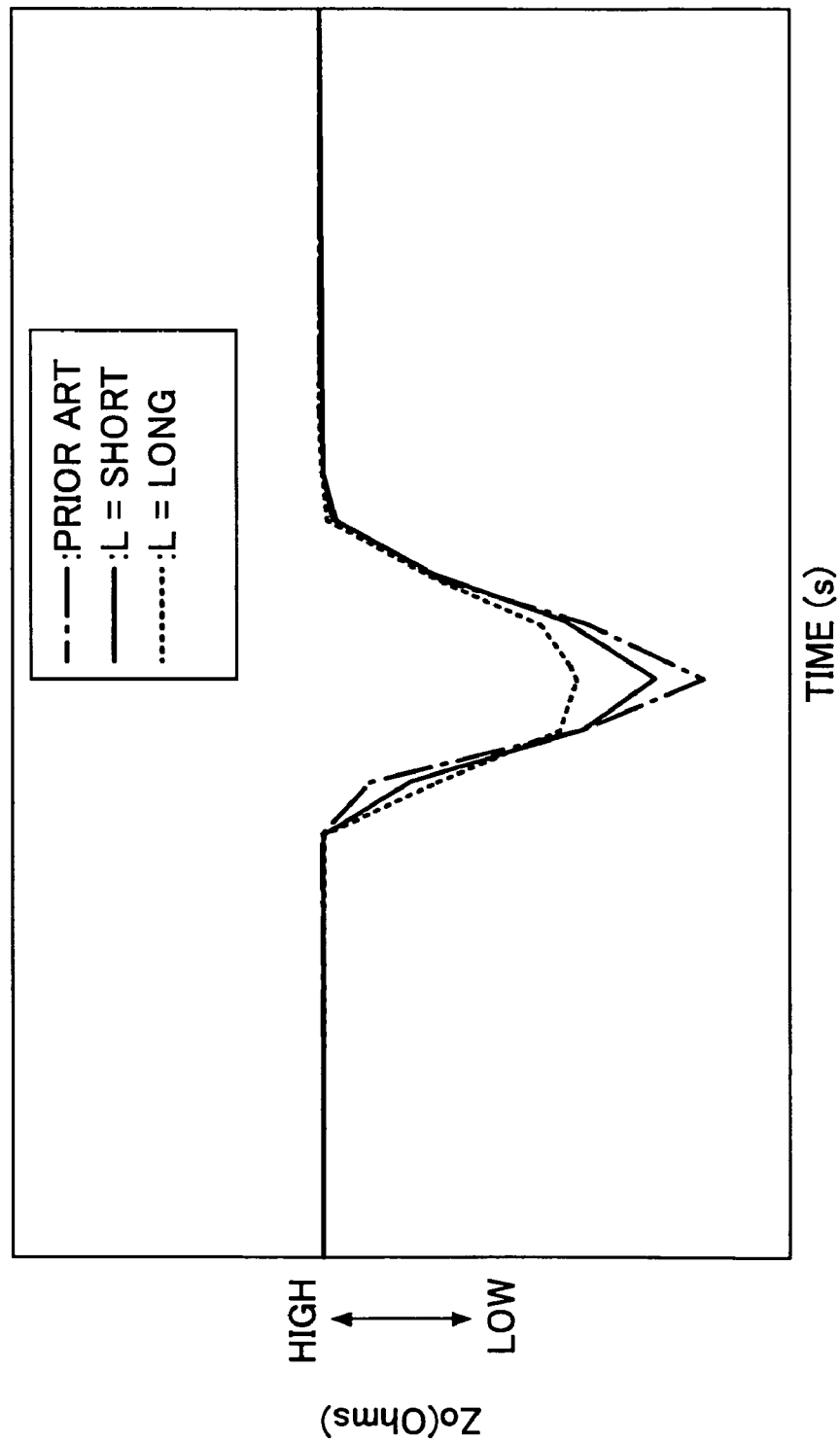
FIG. 5 is a graph showing time domain reflectometry (TDR) waveforms obtained with respect to the pad structure according to the first embodiment.

FIG. 5 is a graph showing time domain reflectometry (TDR) waveforms indicating variations in the characteristic impedance of the transmission line between the lead terminal connecting portion 26 and the pad 1A according to the first embodiment depending on their connection arrangement.

It is noted that time domain reflectometry is a measurement technique used for determining the characteristic impedance of an electrical line by applying an electrical pulse signal with a high rise rate to the electrical line subject to measurement and observing reflected signals that are reflected during propagation of the signals through the electrical line.

The graph of FIG. 5 shows TDR waveforms each obtained by applying an electrical signal with a predetermined rise time. It is noted that the horizontal axis of this graph represents the time, and the vertical axis of this graph represents the characteristic impedance value. This graph shows how the characteristic impedance of the transmission line between a lead terminal and a pad may be adjusted by using the pad structure according to the first embodiment.

Figure 3B:
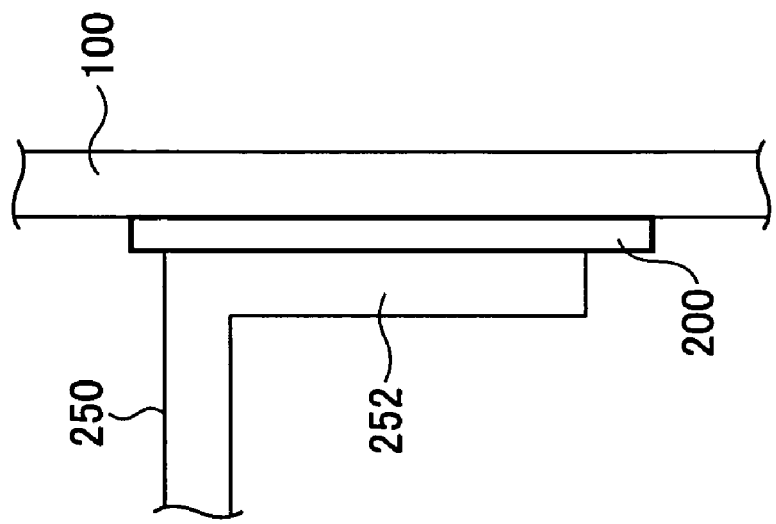
FIGS. 3A and 3B are diagrams showing the connection arrangement between the connector lead terminals and the pads.
Figure 3A:
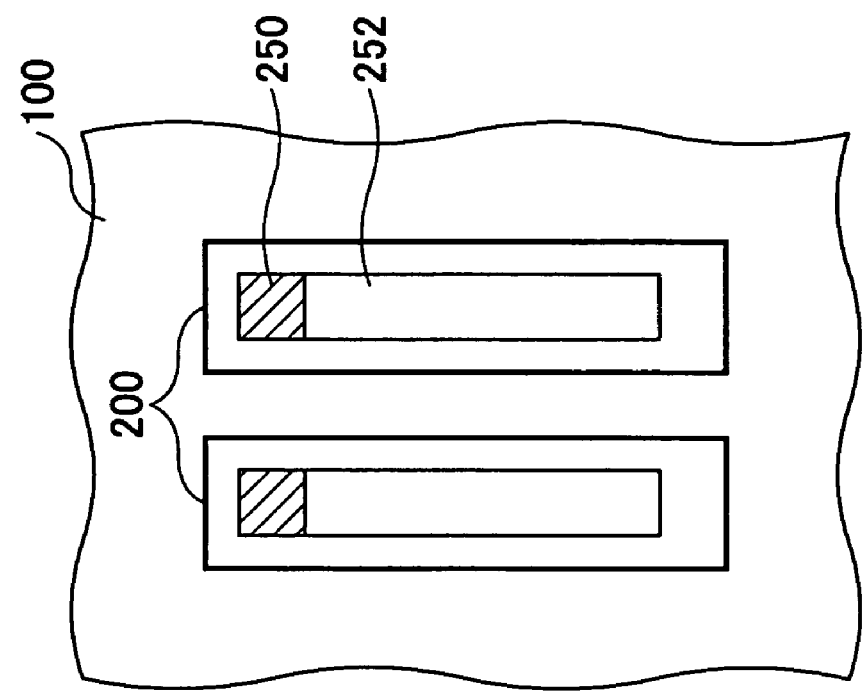

Specifically, provided that the distance between the first pad portion 20 and the second pad portion 21 (i.e., the length of the space portion 30) is denoted by L, the one dotted line shown in FIG. 5 represents a characteristic impedance measurement obtained using a pad structure in which L=0 (i.e., the pad 200 according to the prior art as shown in FIGS. 3A and 3B). The dotted line and the solid line shown in FIG. 5 represent characteristic impedance measurements obtained using the pad structure of the pad 1A according to the present embodiment. Specifically, the dotted line shows the characteristics impedance measurement obtained when the distance L is relatively long; namely, when the ratio of the physical delay time (delay time created by the space portion 30 according to length L) to the rise time is relatively large. The solid line shows the characteristic impedance measurement obtained when the distance L is relatively short; namely, when the ratio of the physical delay time to the rise time is relatively small. It is noted that the characteristic impedance waveforms represented by the above-described one dotted line, dotted line, and solid line correspond to characteristic impedances obtained with respect to the same rise time.

As can be appreciated from the graph of FIG. 5, a characteristic impedance $Z_0$ (Ohms) mismatch may be reduced when the distance L is longer; namely, when the ratio of the physical delay time to the rise time is greater. By using the pad structure according to the present embodiment, the characteristic impedance of the transmission line between the lead terminal and the pad may be more suitably adjusted compared to the case of using the pad structure according to the prior art.

[Second Embodiment]

FIGS. 6A and 6B are diagrams showing a connection arrangement between pads 2A according to a second embodiment of the present invention and the connecting portions 26 of the connector lead terminals 25. Specifically, FIG. 6A is a plan view of two pads 2A connected to corresponding lead terminal connection terminals 26, and FIG. 6B is a corresponding plan view showing regions 40 on which solder is applied upon soldering the lead terminal connecting portions 26 to the pads 2A.

The pad 2A according to the present embodiment includes a rectangular/square first pad portion 20, a rectangular/square second pad portion 21, and a rectangular/square third pad portion 22 arranged between the first and second pad portions 20 and 21. The first through third pad portions 20-22 may be made of a highly conductive metal such as copper, for example.

As is shown in FIG. 6A, the first pad portion 20 and the second pad portion 21 are positioned at the ends of the lead terminal connecting portion 26. As is shown in FIG. 6B, the ends of the lead terminal connecting portion 26 are soldered to the first and second pad portions 20 and 22. In the present embodiment, portions of the lead terminal connecting portion 26 between the first pad portion 20 and the third pad portion 22 and between the second pad portion 21 and the third pad portion 22 are not connected to a pad portion. It is noted that portions corresponding to the locations where the lead terminal connecting portion 26 does not come into contact with a pad portion are regarded as space portions 30 of the pad 2A.

The third pad portion 22 is positioned at approximately the center of the lead terminal connecting portion 26. The third pad portion is separated from both the first pad portion 20 and the second pad portion 21 by a certain distance. As is shown in FIG. 6B, the third pad portion 22 is soldered to a region 50 of the lead terminal connecting portion 26 having a predetermined length $L_2$.

The second pad portion 21 functions as an electrical connection terminal of a substrate that conveys electrical signals from the lead terminal to a circuit portion of the substrate. On the other hand, the first and third pad portions 20 and 22 are configured to reinforce the mechanical strength of the connection between the lead terminal connecting portion 26 and the substrate and to adjust the characteristic impedance of the transmission line between the lead terminal 25 and the pad 2A.

Figure 7:
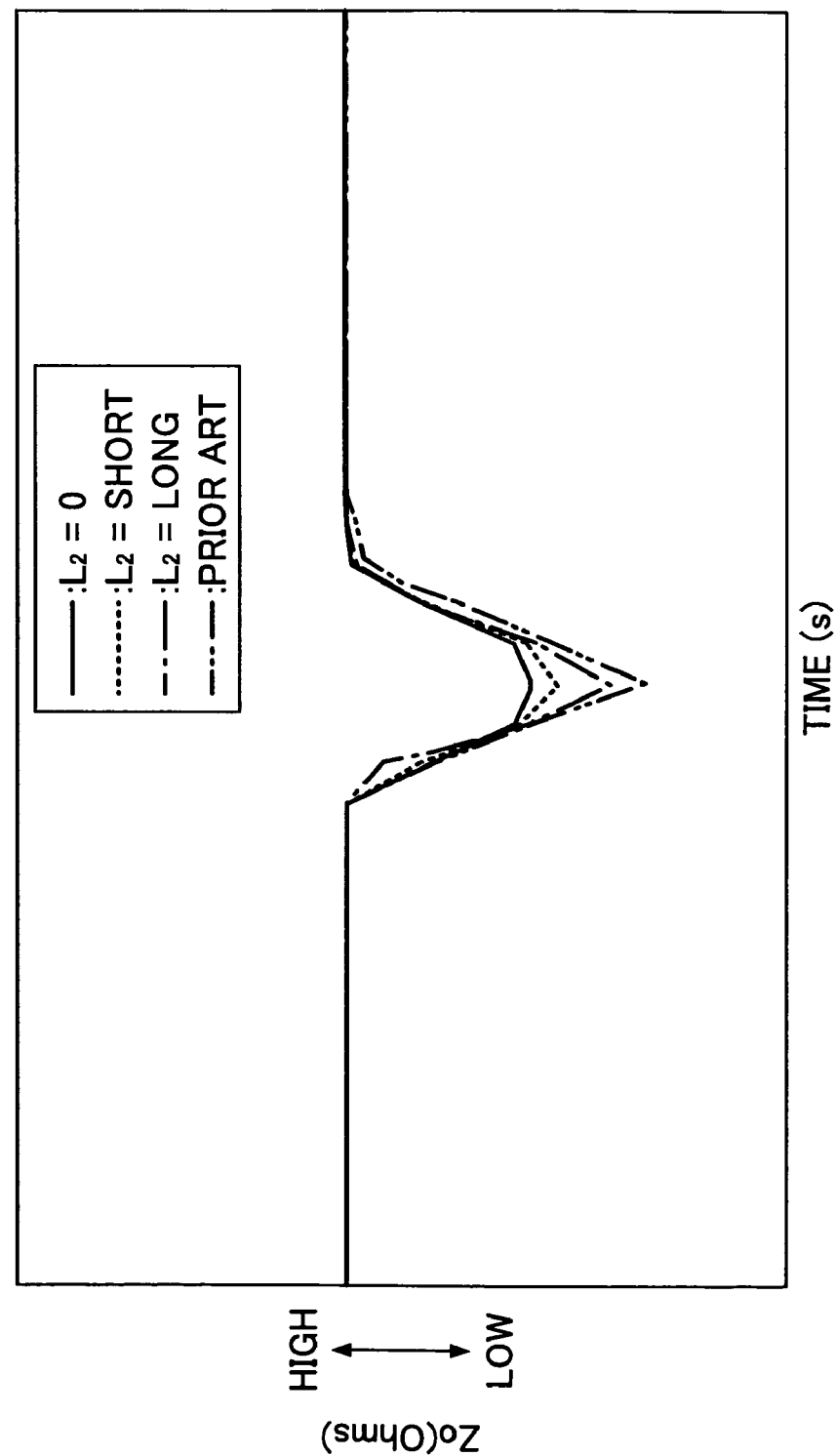
FIG. 7 is a graph showing time domain reflectometry (TDR) waveforms obtained with respect to the pad structure according to the second embodiment.

FIG. 7 is a graph showing TDR waveforms indicating variations in the characteristic impedance of the transmission line between the lead terminal connecting portion 26 and the pad 2A according to the second embodiment depending on their connection arrangement.

Specifically, the graph of FIG. 7 shows TDR waveforms each obtained by applying an electrical pulse signal with a predetermined rise time (same rise time as the electrical pulse signal used for obtaining the TDR waveforms shown in FIG. 5). It is noted that the horizontal axis of this graph represents the time, and the vertical axis of this graph represents the characteristic impedance value. This graph shows how the characteristic impedance of the transmission line between a lead terminal and a substrate pad may be adjusted by using the pad structure according to the second embodiment.

In the graph of FIG. 7, L2 denotes the length of the third pad portion 22 along the longitudinal direction of the lead terminal connecting portion 26. The one dotted line and the dotted line shown in FIG. 7 represent characteristic impedance measurements obtained when using the pad 2A according to the second embodiment. Specifically, the one dotted line represents the characteristic impedance measurement obtained in a case where the length L2 is relatively long; namely, when the ratio of the physical delay time (delay time created by the space portions 30 according to the length L2) to the rise time is relatively small, and the dotted line represents the characteristic impedance measurement obtained in a case where the length L2 is relatively short; namely, when the ratio of the physical delay time to the rise time is relatively large. The solid line shown in FIG. 7 represents the characteristic impedance measurement obtained using a pad structure in which L2=0 (i.e., the pad 1A according to the first embodiment), and the two dotted line represents the characteristic impedance measurement obtained using the pad 200 according to the prior art. It is noted that the above-described characteristic impedance waveforms represented by the one dotted line, two dotted line, dotted line, and solid line correspond to characteristic impedances measured using electric pulse signals with the same rise time.

As can be appreciated from the graph of FIG. 7, a characteristic impedance mismatch may be reduced when the length L2 is shorter; namely, when the ratio of the physical delay time to the rise time is larger. By using the pad structure according to the present embodiment including the space portions 30, the characteristic impedance of the transmission line between the lead terminal and the pad may be more suitably adjusted compared to the case of using the pad structure according to the prior art.

[Third Embodiment]

Figure 8:
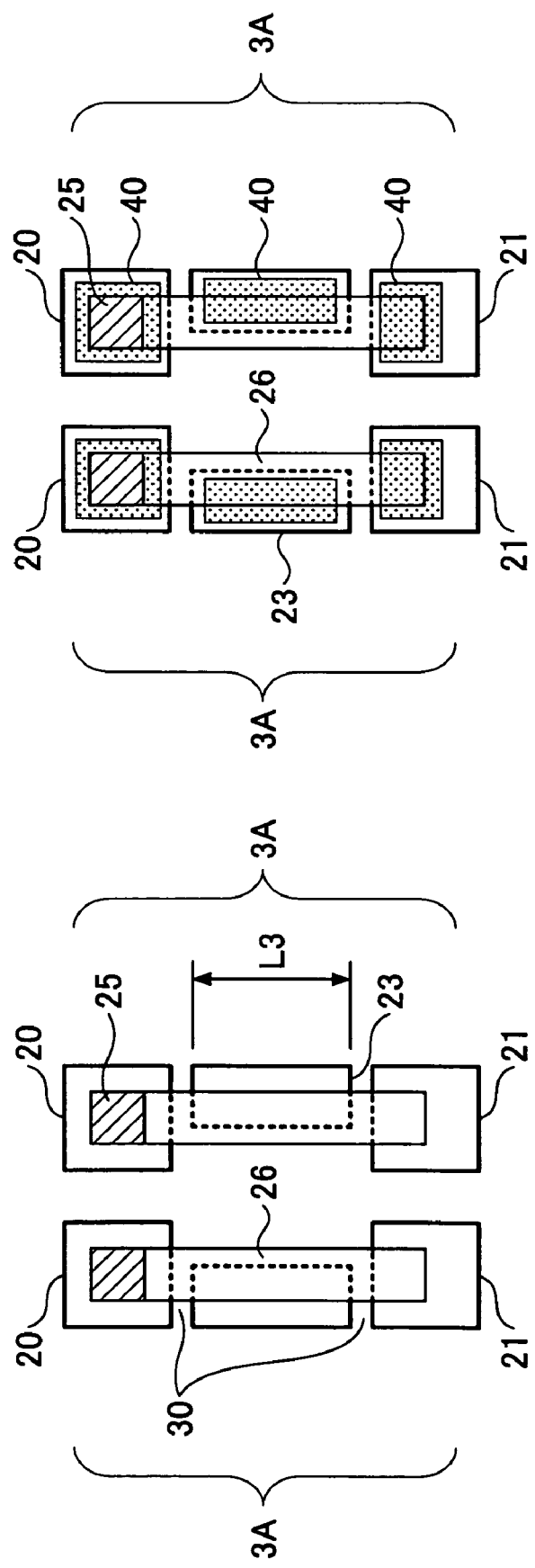
FIGS. 8A and 8B are diagrams showing a connection arrangement between lead terminal connecting portions and pads according to a third embodiment of the present invention.

FIGS. 8A and 8B are diagrams showing a connection arrangement between pads 3A according to a third embodiment of the present invention and the connecting portions 26 of the connector lead terminals 25. Specifically, FIG. 8A is a plan view of two pads 3A connected to the lead terminal connecting portions 26, and FIG. 8B is a corresponding side view showing regions 40 on which solder is applied upon soldering the lead terminal connecting portions 26 to the pads 3A.

The pad 3A according to the third embodiment includes a third pad portion 23 in addition to a first pad portion 20 and a second pad portion 21. It is noted that the first and second pad portions 20 and 21 may be identical to those of the pad 2A according to the second embodiment so that descriptions thereof are omitted.

As with the second embodiment, the third pad portion 23 of the pad 3A according to the present embodiment is arranged between the first pad portion 20 and the second pad portion 21, and is separated from both the first pad portion 20 and the second pad portion 21 by a certain distance. In the present embodiment, the third pad portion 23 is arranged into a rectangular shape with its long side being arranged parallel to the longitudinal direction of the lead terminal connecting portion 26. Also, the third pad portion 23 is deviated in the transverse direction toward one long side of the lead terminal connecting portion 26. Accordingly, a left-half side or a right-half side of a portion of the lead terminal connecting portion 26 extending along a length L3 of the third pad portion 23 is not connected to the third pad portion 23. It is noted that portions corresponding to locations where the lead terminal connecting portion 26 does not come into contact with a pad portion are regarded as a space portion 30 of the pad 3A.

In the embodiment shown in FIGS. 8A and 8B, the second pad portion 21 functions as an electrical connection terminal of a substrate that conveys an electrical signal from a lead terminal to a circuit portion of the substrate. On the other hand, the first pad portion 20 and the third pad portion 23 are configured to reinforce the mechanical strength of the connection between the lead terminal connecting portion 26 and the substrate, and to adjust the characteristic impedance of the transmission line between the lead terminal 25 and the pad 3A.

Figure 9:
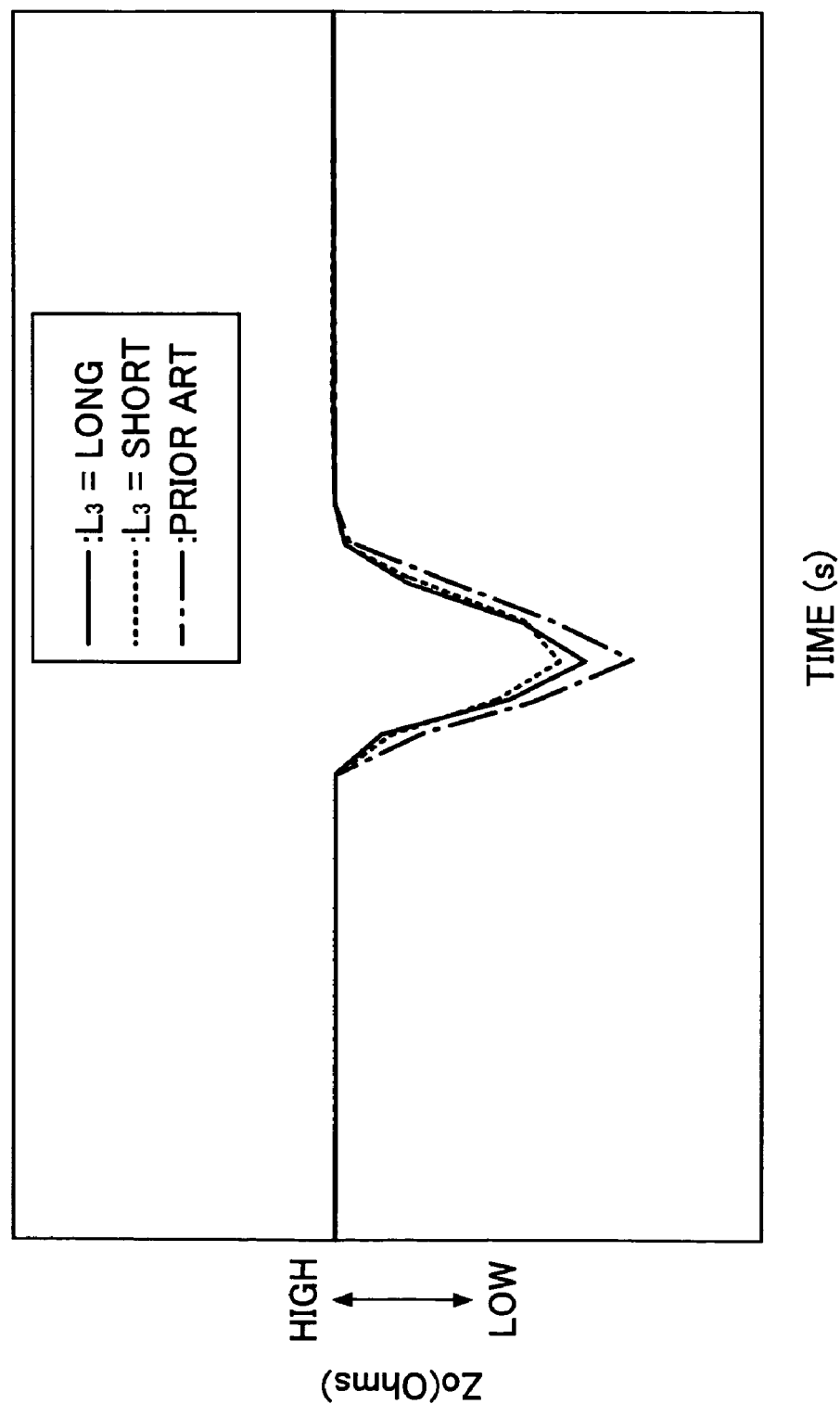
FIG. 9 is a graph showing time domain reflectometry (TDR) waveforms obtained with respect to the pad structure according to the third embodiment.

FIG. 9 is a graph showing TDR waveforms indicating variations in the characteristic impedance of the transmission line between the lead terminal connecting portion 26 and the pad 3A according to the third embodiment shown in FIGS. 3A and 3B, depending on their connection arrangement.

Specifically, the graph of FIG. 9 shows TDR waveforms, each obtained by applying an electrical pulse signal with a predetermined rise time (same rise time as the electrical pulse signal used for obtaining the TDR waveforms shown in FIGS. 5 and 7). It is noted that the horizontal axis of this graph represents the time, and the vertical axis of this graph represents the characteristic impedance value. This graph shows how the characteristic impedance of the transmission line between a lead terminal and a substrate pad may be adjusted by using the pad structure according to the third embodiment.

In the graph of FIG. 9, L3 denotes the length of the third pad portion 23 along the longitudinal direction of the lead terminal connecting portion 26. The dotted line and the solid line shown in FIG. 9 represent characteristic impedance measurements obtained using the pad 3A according to the third embodiment. Specifically, the dotted line represents the characteristic impedance measurement obtained in a case where the length L3 is relatively short; namely, when the ratio of the physical delay time (delay time created by the space portion 30 according to the length L3) to the rise time is relatively large, and the solid line represents the characteristic impedance measurement obtained in a case where the length L3 is relatively long; namely, when the ratio of the physical delay time to the rise time is relatively small. The one dotted line shown in FIG. 9 represents the characteristic impedance measurement obtained using a pad structure in which L3=0 (i.e., the pad 200 according to the prior art). It is noted that the above-described characteristic impedance waveforms represented by the one-dotted line, the dotted line, and the solid line correspond to characteristic impedances measured using electric pulse signals with the same rise time.

As can be appreciated from the graph of FIG. 9, a characteristic impedance mismatch may be reduced when the length L3 is shorter; namely, when the ratio of the physical delay time to the rise time is larger. By using the pad structure according to the present embodiment, the characteristic impedance of the transmission line between the lead terminal and the pad may be more suitably adjusted compared to the case of using the pad structure according to the prior art.

[Fourth Embodiment]

Figure 10A:
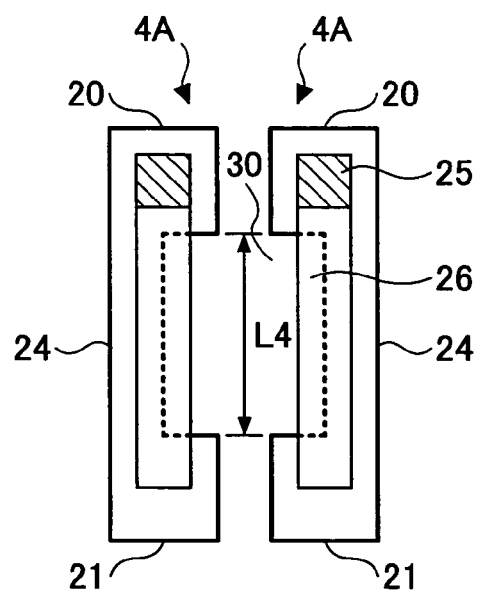
FIGS. 10A and 10B are diagrams showing a connection arrangement between lead terminal connecting portions and pads according to a fourth embodiment of the present invention.
Figure 10B:
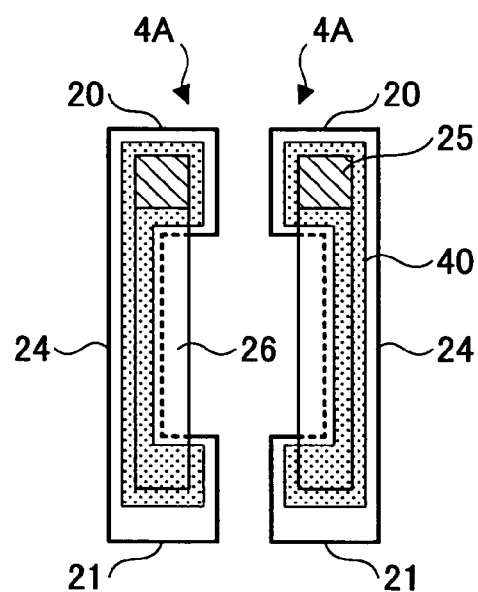

FIGS. 10A and 10B are diagrams showing a connection arrangement between pads 3A according to a fourth embodiment of the present invention and the connecting portions 26 of the connector lead terminals 25. Specifically, FIG. 10A is a plan view of two pads 4A connected to the lead terminal connecting portions 26, and FIG. 10B is a corresponding side view showing regions 40 on which solder is applied upon soldering the lead terminal connecting portions 26 to the pads 4A.

The pad 4A according to the fourth embodiment includes a rectangular/square first pad portion 20, a rectangular/square second pad portion 21, and a third pad portion 24 arranged between the first and second pad portions 20 and 21. It is noted that the first through third pad portions 20, 21, and 24 may be made of a metal with relatively high conductivity such as copper, for example.

In the present embodiment, as is shown in FIG. 10A, the first pad portion 20 and the second pad portion 21 are positioned at the ends of the lead terminal connecting portion 26. The ends of the lead terminal connecting portion 26 are soldered to the first and second pad portions 20 and 21.

The third pad portion 24 of the pad 4A according to the present embodiment is rectangular in shape and is arranged parallel to the longitudinal direction of the lead terminal connecting portion 26. As is shown in FIG. 10A, the lateral side edges of the third pad 24 are connected to the inner side edges of the first and second pad portions 20 and 21 (i.e., the third pad portion 24 is not separated from the first and second pad portions 20 and 21). Also, the rectangular third pad portion 24 is deviated in the transverse direction toward one long side of the lead terminal connecting portion 26. Accordingly, a left-half side or a right-half side of a portion of the lead terminal connecting portion 26 positioned between the first and second pad portions 20 and 21 is not connected to the third pad portion 24. It is noted that a portion corresponding to the location where the lead terminal connecting portion 26 does not come into contact with a pad portion is regarded as a space portion 30 of the pad 4A.

In the present embodiment, the second pad portion 21 functions as an electrical connection terminal of a substrate that conveys an electrical signal from a lead terminal to a circuit portion of the substrate. On the other hand, the first pad portion 20 and the third pad portion 24 are configured to reinforce the mechanical strength of the connection between the lead terminal connecting portion 26 and the substrate, and adjust the characteristic impedance of the transmission line between the lead terminal 25 and the pad 3A.

FIG. 11 is a graph showing TDR waveforms indicating variations in the characteristic impedance of the transmission line between the lead terminal connecting portion 26 and the pad 4A according to the fourth embodiment depending on their connection arrangement.

Specifically, the graph of FIG. 11 shows TDR waveforms each obtained by applying an electrical pulse signal with a predetermined rise time (same rise time as the electrical pulse signal used for obtaining the TDR waveforms shown in FIGS. 5, 7, and 9). It is noted that the horizontal axis of this graph represents the time, and the vertical axis of this graph represents the characteristic impedance value. This graph shows how the characteristic impedance of a transmission line between a lead terminal and a substrate pad may be adjusted by using the pad structure according to the fourth embodiment.

In the graph of FIG. 11, L4 denotes the distance between the first pad portion 20 and the second pad portion 21 (i.e., the length of the space portion 30) of the pad 4A. The dotted line and the solid line shown in FIG. 11 represent characteristic impedance measurements obtained when using the pad 4A according to the fourth embodiment. Specifically, the dotted line represents the characteristic impedance measurement obtained in a case where the length L4 is relatively long; namely, when the ratio of the physical delay time (delay time created by the space portion 30 according to the length L4) to the rise time is relatively large, and the solid line represents the characteristic impedance measurement obtained in a case where the length L3 is relatively short; namely, when the ratio of the physical delay time to the rise time is relatively small. The one dotted line shown in FIG. 11 represents the characteristic impedance measurement obtained using a pad structure in which L4=0 (i.e., the pad 200 according to the prior art). It is noted that the above-described characteristic impedance waveforms represented by the one-dotted line, the dotted line, and the solid line correspond to characteristic impedances measured using electric pulse signals with the same rise time.

As can be appreciated from the graph of FIG. 11, a characteristic impedance mismatch may be reduced when the length L4 is longer; namely, when the ratio of the physical delay time to the rise time is larger. By using the pad structure according to the present embodiment, the characteristic impedance of the transmission line between the lead terminal and the pad may be more suitably adjusted compared to the case of using the pad structure according to the prior art.

According to the above-described embodiments of the present invention, a substrate pad structure may be provided that is configured to adjust characteristic impedance matching between a connector lead terminal of an electronic device and a pad while reinforcing the connection between a connecting portion of the lead terminal and the pad.

Further, although the present invention is described above with respect to certain specific embodiments, the present invention is not limited to these embodiments and variations and modifications may be made without departing from the scope of the present invention.

The present application is based on and claims the benefit of the earlier filing date of Japanese Patent Application No. 2007-316704 filed on Dec. 7, 2007, the entire contents of which are hereby incorporated by reference.

What is claimed is:

1. A substrate pad structure for connecting a lead connecting portion of an electronic device to a substrate, the substrate pad structure comprising:
    a first pad portion and a second pad portion that are arranged on the substrate at corresponding positions of two end regions of the lead connecting portion, which has a continuous oblong shape, and
    a third pad portion that is arranged between the first pad portion and the second pad portion and is distanced from the first pad portion and the second pad portion;
    wherein a space portion is provided between the first pad portion and the second pad portion, and the lead connecting portion includes a non-connected region located at a corresponding position of the space portion,
    only one of the first and second pad portions is an electrical connection terminal,
    the other of the first and second pad portions is not the electrical connection terminal, is configured to reinforce a mechanical strength of a connection between the lead connection portion and the substrate, and adjust a characteristic impedance of the substrate pad structure, and
    the third pad portion is arranged parallel to a longitudinal direction of the lead connecting portion, and an entirety of the third portion is deviated in a transverse direction relative to the longitudinal direction of the lead connecting portion so that only half of the lead connecting-portion in the transverse direction is connected to the third pad portion.

2. The substrate pad structure as claimed in claim 1, wherein the third pad is configured to reinforce a mechanical strength of a connection between the lead connection portion and the substrate, and adjust a characteristic impedance of the substrate pad structure.

3. The substrate pad structure as claimed in claim 1, wherein the third pad has a rectangular shape having a longitudinal side, said longitudinal side being parallel to the longitudinal direction of the lead connecting portion.

4. The substrate pad structure as claimed in claim 1, wherein the third pad is formed by one body, and
    the only half of the lead connecting portion in the transverse direction is connected to the third pad, and the other half of the lead connecting portion in the transverse direction and the substrate form a space portion therebetween.

5. The substrate pad structure as claimed in claim 4, wherein the third pad has distal ends configured to connect the third pad and the first and second pads, respectively.

6. An electronic device, comprising:
    a substrate; and a plurality of substrate pad structures provided on the substrate for connecting a lead connecting portion of the electronic device to the substrate, each of the plurality of substrate pad structures including:
  a first pad portion and a second pad portion that are arranged on the substrate at corresponding positions of two end regions of the lead connecting portion, which has a continuous oblong shape, and
  a third pad portion that is arranged between the first pad portion and the second pad portion and is distanced from the first pad portion and the second pad portion;
wherein a space portion is provided between the first pad portion and the second pad portion, and the lead connecting portion includes a non-connected region located at a corresponding position of the space portion,
only one of the first and second pad portions is an electrical connection terminal,
the other of the first and second pad portions is not the electrical connection terminal, is configured to reinforce a mechanical strength of a connection between the lead connection portion and the substrate, and adjust a characteristic impedance of the substrate pad structure,
the third pad portion is arranged parallel to a longitudinal direction of the lead connecting portion, and an entirety of the third portion is deviated in a transverse direction relative to the longitudinal direction of the lead connecting portion so that only half of the lead connecting portion in the transverse direction is connected to the third pad portion, and
the third pad is deviated in an opposite direction to a direction in which a third pad of another substrate pad structure adjacent to the substrate pad structure is deviated.

7. The electronic device as claimed in claim 6, wherein the third pad is formed by one body, and
  the only half of the lead connecting portion in the transverse direction is connected to the third pad, and the other half of the lead connecting portion in the transverse direction and the substrate form a space portion therebetween.

8. The electronic device as claimed in claim 7, wherein the third pad has distal ends configured to connect the third pad and the first and second pads, respectively.

* * * * *